United States Patent
Sakao

(10) Patent No.: US 6,483,194 B2
(45) Date of Patent: Nov. 19, 2002

(54) SEMICONDUCTOR DEVICE HAVING CAPACITOR AND METHOD THEREOF

(75) Inventor: Masato Sakao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/801,679

(22) Filed: Mar. 9, 2001

(65) Prior Publication Data

US 2001/0050436 A1 Dec. 13, 2001

(30) Foreign Application Priority Data

Mar. 10, 2000 (JP) ........................................ 2000-066464

(51) Int. Cl.[7] .............................................. H01L 23/48
(52) U.S. Cl. ...................... 257/760; 257/295; 257/761; 257/769
(58) Field of Search ................................ 257/295, 306, 257/310, 761, 769; 438/580, 608, 609

(56) References Cited

U.S. PATENT DOCUMENTS 6,313,539 B1 * 11/2001 Yokoyama et al. ......... 257/761

OTHER PUBLICATIONS

M. Hamada et al., "A High–Performance 0.18–$\mu$m Merged DRAM/Logic Technology Featuring 0.45–$\mu$m Stacked Capacitor Cell", International Electron Devices Meeting, (1999), pp. 2.6.1–2.6.4 with Abstract.

* cited by examiner

*Primary Examiner*—David Nelms
*Assistant Examiner*—Mai-Huong Tran
(74) *Attorney, Agent, or Firm*—Sughrue Mion, PLLC

(57) ABSTRACT

A semiconductor device includes a semiconductor substrate, a first interlayer dielectric film covering the semiconductor substrate, a second interlayer dielectric film covering the first interlayer dielectric, an opening having an upper-layer opening penetrating the second interlayer dielectric film, and a lower-layer opening penetrating the first interlayer dielectric film down to the surface of the semiconductor substrate and being connected to the upper-layer opening. The lower-layer opening being arranged such that diameter of the lower-layer reduces gradually from the upper-layer opening toward the semiconductor substrate. A conductive film covering at least the bottom surface of the lower-layer opening and side walls of the lower-layer and upper-layer openings.

9 Claims, 11 Drawing Sheets

SEMICONDUCTOR DEVICE HAVING CAPACITOR AND METHOD THEREOF

BACKGROUND OF THE INVENTION

1. Field of the Invention

The present invention relates to a semiconductor memory and a fabricating method thereof, in particular to a dynamic random access memory and a method thereof.

2. Description of the Related Art

An SOC (System on a Chip) device technique has been expected as the technique capable of remarkably enhancing the performance of an LSI system. This technique opens up new possibilities for reaching the world which could not be achieved by a system of discrete LSI chips in combination. For example, power consumption can be remarkably reduced or prodigious data-transfer ability can be achieved by equipping one chip with a large-capacity memory device and a logic device. In particular, a dynamic random access memory (DRAM) hybrid logic device has been developed all over the place in view of its market scale. In order to establish the business of the DRAM hybrid logic device together with technical possibility, it is important to form the device at a proper cost.

Based on such a concept, IEDM 99, pp. 45–48 discloses the structure and process for fabricating the device (refer to FIGS. 7 and 8 in the present specification).

In this technique, silicide technique of $CoSi_2$ (cobalt silicide) used in a logic unit is introduced also in a memory cell for a DRAM. The structures of transistors in a memory cell unit and the logic unit become identical to each other by using $CoSi_2$ also in the memory cell. Consequently, it is unnecessary to use a special (additional) process required in the case where the transistors are constituted of different structures, thus preventing any increase in the number of processes.

However, the process for forming a DRAM cell is an additional one with respect to the process for forming only a logic device. Therefore, it is important to eliminate the process for forming the DRAM cell from the viewpoint of the reduction of the number of processes.

In the related art, the process for forming all constituent elements is used for forming the DRAM cell. That is, the process includes the process for forming a capacitor contact constituting the capacitor of a memory cell and a cylinder (an accumulation electrode).

In this manner, the fabrication of the capacitor contact and the cylinder by two kinds (two processes) of mask works is caused by, in particular, the plane layout and fabricating processes of the memory cell.

First of all, explanation will be made below on the plane layout of the DRAM cell in the related art. FIG. 8 illustrates the plane layout of the DRAM cell in the related art. In the same manner, FIG. 7 is a cross-sectional view showing mainly a capacitor plate (an opposite electrode) and a bit line, taken along a line C–C' of FIG. 8 illustrating the plane layout.

As shown in FIG. 8, all of the intervals between bit line contacts 317 formed on one bit line 319 are fixed, bit line contacts formed on an adjacent bit line are arrayed in such a manner that a contact formed on the adjacent bit line is located at a position just half of the interval between the bit line contacts. This may be referred to as the array of a half pitch.

In this layout, the memory cell is laid out in such a manner as to increase the size of the cylinder as possible since the size of the cylinder is proportional to the cell capacity. As for a cylinder opening 312 and a capacitor contact 313 illustrated in FIG. 8, the interval between adjacent cylinders is great in a longitudinal direction of the bit line 319 but is small in a direction perpendicular to the bit line 319. The adjacent capacitor contact 313 is located between word lines 304 (gate electrodes 204 in FIG. 7). The cylinder openings 312 are laid out in different dimensions in X and Y directions in such a manner as to extend above the word line 304 (the gate electrode 204 in FIG. 7) in order to enlarge the size in the direction in which the interval between the cylinders is greater.

FIG. 7 is the cross-sectional view showing the memory cell, in which there are used 200's reference numerals corresponding to 300's reference numerals used in the plan view of FIG. 8.

The gate electrode 204 and impurity diffusion layers 206 and 207, constituting a memory cell transistor, are formed on a silicon substrate 201. A capacitor plate 216 is formed via an accumulation electrode 214 and a capacitor insulating film 215 constituting a capacitor of the memory cell. Furthermore, a bit line contact 217 for writing or reading data in or out of the memory cell is connected to the memory cell transistor and the bit line 319 illustrated in FIG. 8, and therefore, is opened through a first inter layer film 210 and a second interlayer film 211.

Next, a description will be given of the process for fabricating the memory cell in there late dart. Although a layout is different, processes to a process for forming the gate electrode and a stopper nitride film are the same as those in embodiments according to the present invention, and therefore, their description will be omitted here (see the description in the embodiments). The sequentially fabricating processes are illustrated in FIGS. 9A to 9D.

First of all, as illustrated in FIG. 9A, after formation of as topper nitride film, a BPSG film is formed, thereby obtaining the first interlayer film 210. Subsequently, photolithography is carried out, thereby obtaining a resist 222, followed by the etching by the use of a resist 222 as a mask, whereby the capacitor contact 213 is opened.

Thereafter, polycrystalline silicon doped with impurities is grown over the entire surface, followed by etching back by dry etching, thereby forming a capacitor contact plug 233, as illustrated in FIG. 9B. Furthermore, a BPSG film is formed, thus obtaining the second interlayer film 211. And then, the second interlayer film 211 is subjected to photolithography and dry etching, thereby shaping a resist 242 and the cylinder opening 212.

Moreover, as illustrated in FIG. 9C, HSG silicon doped with impurities is deposited on the cylinder opening 212 and the second interlayer film 211, there by obtaining an accumulation electrode material 214a. Subsequently, the cylinder opening 212 covered with the accumulation electrode material 214a is filled with a resist 262.

In this state, the accumulation electrode material 214a is etched back so as to obtain an accumulation electrode 214 with the accumulation electrode material 214a remaining only inside of the cylinder opening 212. Subsequently, as illustrated in FIG. 9D, the capacitor insulating film 215 made of $Ta_2O_5$ (tantalum oxide) is formed on the accumulation electrode 214. Furthermore, TiN (titanium nitride) and polycrystalline silicon doped with impurities are laminated in sequence.

Thereafter, the capacitor plate 216 illustrated in FIG. 9D is formed by photolithography and dry etching. Moreover, there is formed a third interlayer film 221 covering the capacitor plate 216, and then, the bit line contact 217 is formed by photolithography and dry etching. In this state, a film is formed of Ti (titanium) and TiN, and then, tungsten is embedded into the bit line contact, thereby obtaining a bit line plug 218 illustrated in FIG. 7. Subsequently, a film is formed of TiN, thereby obtaining a bit line 219 illustrated in FIG. 7 also by photolithography and dry etching. Thereafter, a fourth interlayer film 222 is formed, thus obtaining the memory cell in the related art.

The layout of the memory cell and the method for fabricating the capacitor contact for the memory cell have been described above. The layout of the memory cell experiences a problem as follows.

The cylinder for the capacitor is laid out in as large a size as possible, and further, the capacitor contact is as compactly laid out as possible in such a manner as to be inserted between the word lines (the gate electrodes): that is, both of the cylinder and the capacitor contact are laid out on the utterly different concepts, and as a result, there still remains plenty of room for reduction of the cell size.

Additionally, the method for fabricating the capacitor contact for the memory cell experiences a problem as follows.

It is important to reduce the number of fabricating processes in order to reduce a cost. However, the capacitor contact (designated by reference numeral 213 in FIG. 7 and reference numeral 313 in FIG. 8) and the cylinder opening (designated by reference numeral 212 in FIG. 7 and reference numeral 312 in FIG. 8) constituting the capacitor for the memory cell are formed in the independent processes in the related art, thus inducing an increase in the number of fabricating processes.

As described above, it has been indispensable in the layout used in the related art to constitute the capacitor contact and the cylinder in the two kinds of mask works.

In other words, since the function and structure of the capacitor contact are normally different from those of the cylinder (an accumulation electrode forming region), the two kinds of mask works (or two kinds of mask layers) are used. As is seen from the plane layout of the memory cell in the related art as illustrated in FIG. 8, the cylinder (the cylinder opening 312) and the capacitor contact are not formed into the same shape as each other, and further, are different in positional relationship. Consequently, the cylinder and the capacitor contact cannot be formed by using one and the same mask.

SUMMARY OF THE INVENTION

An object of the present invention is to provide a semiconductor device and a fabricating method thereof in which the number of processes of fabricating a DRAM cell and the area of a memory cell can be reduced.

A semiconductor device of the present invention includes, a semiconductor substrate, a first interlayer dielectric film covering the semiconductor substrate, a second interlayer dielectric film covering the first interlayer dielectric film, an opening having an upper-layer opening penetrating the second interlayer dielectric film, and a lower-layer opening penetrating the first interlayer dielectric film down to the surface of the semiconductor substrate and being connected to the upper-layer opening, the lower-layer opening being arranged such that diameter of the lower-layer reduces gradually from the upper-layer opening toward the semiconductor substrate, and a conductive film covering at least the bottom surface of the lower-layer opening and side walls of the lower-layer and upper-layer openings.

A semiconductor device of the present invention includes: a semiconductor substrate, a plurality of bit lines formed over the semiconductor substrate arranged in a first direction in that order, each of bit lines extending in a second direction substantially perpendicular to the first direction, a plurality of bit line contacts connected to the respective bit lines and the semiconductor substrate, and a plurality of capacitor contacts connected to the semiconductor substrate, wherein a first bit line contact of the bit line contacts connected to a first bit line of the bit lines and a second bit line contact of the bit line contacts connected to a second bit line of the bit lines are arranged at a line extending in the first direction, the capacitor contacts are arranged at the line.

A method of forming a semiconductor device of the present invention comprising:

forming a first interlayer insulating film on the semiconductor substrate;

forming a second interlayer insulating film on the first interlayer insulating film;

forming a first contact hole through the second interlayer insulating film to expose surface of the first interlayer insulating film;

forming a second contact hole through the first interlayer insulating film to expose surface of the semiconductor substrate and being connected to the first contact hole; and forming a conductive film covering at least the exposed surface of the semiconductor substrate and the side walls of the first and second interlayer insulating films exposed by the first and second contact hole;

wherein the second contact hole is formed into such a shape that diameter of the first contact hole reduces gradually from the second contact hole toward the semiconductor substrate.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Figure 1:
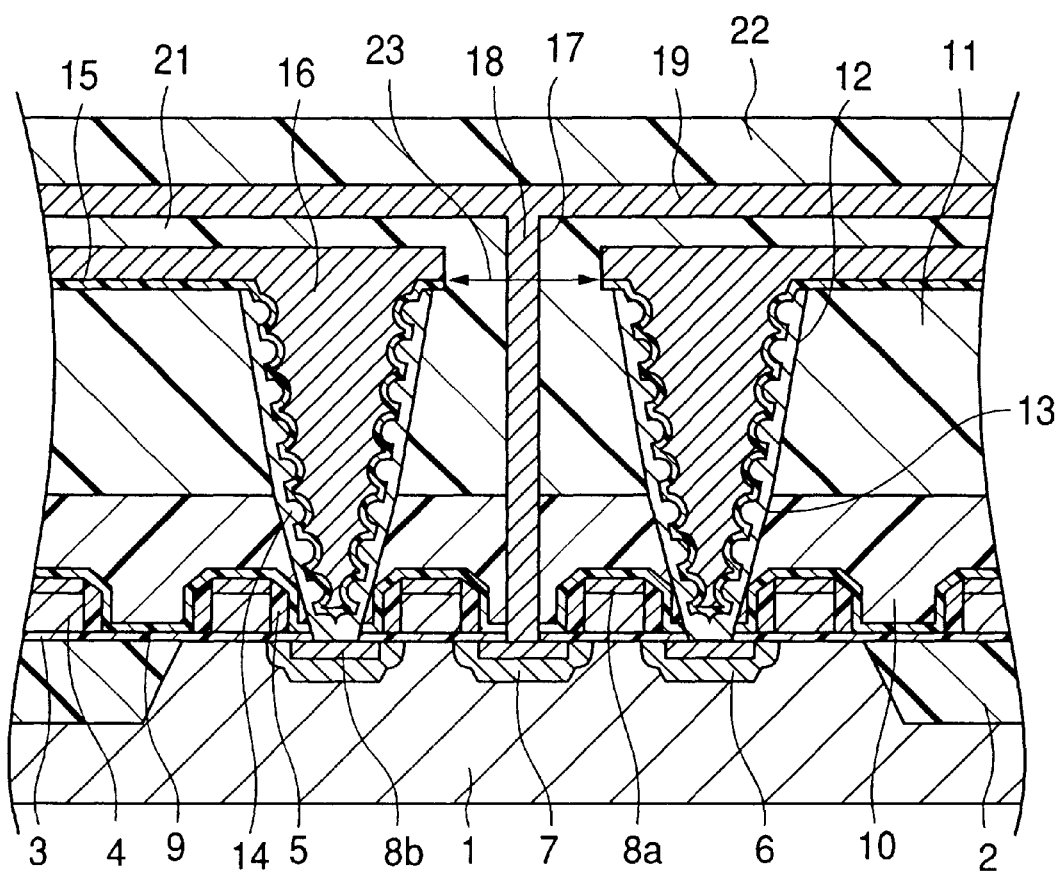
FIG. 1 is a cross-sectional view showing a semiconductor device in a first embodiment according to the present invention.
Figure 2:
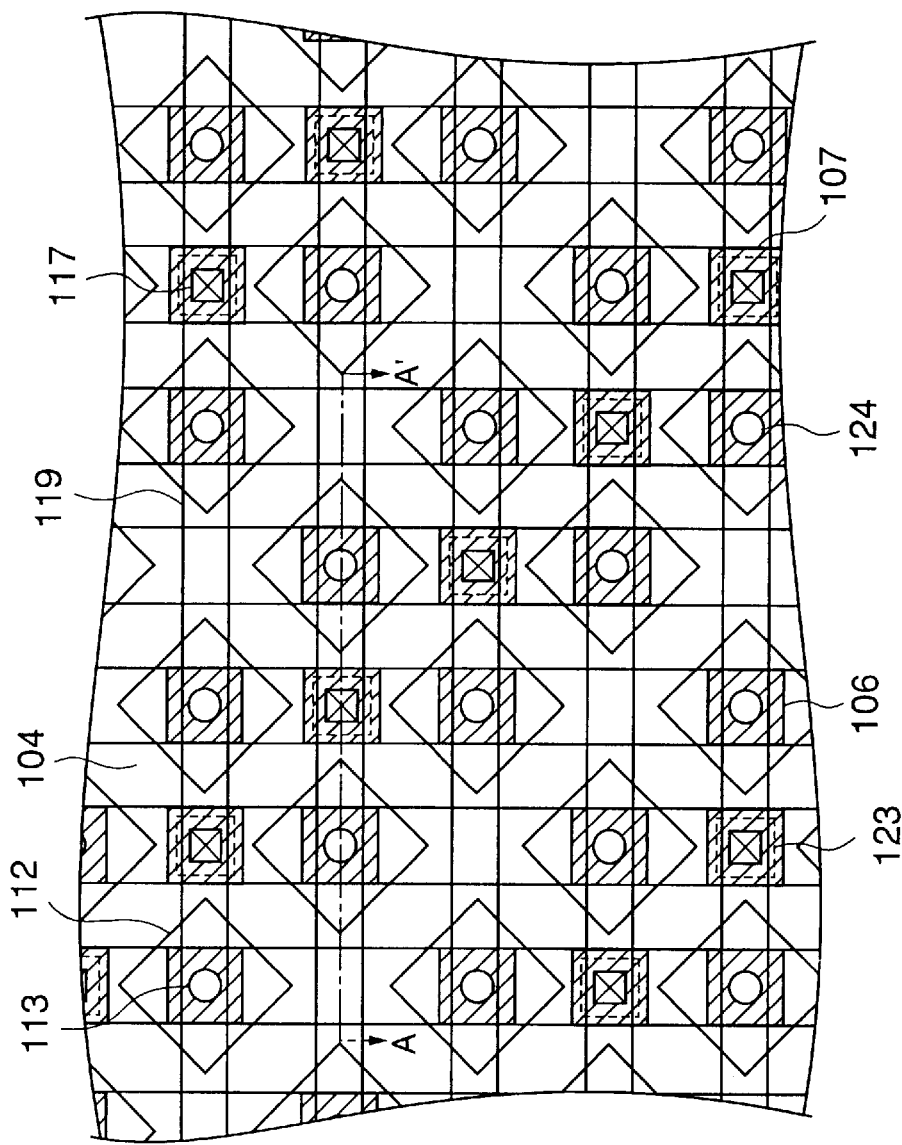
FIG. 2 is a plan view showing the semiconductor device in the first embodiment according to the present invention.

A first embodiment according to the present invention will be described in reference to FIGS. 1 and 2. FIG. 1 is a cross-sectional view showing the structure of a DRAM cell in the present embodiment; and FIG. 2 illustrates a plane layout of the DRAM cell in the present embodiment, focusing on a capacitor plate (an opposite electrode) and a bit line. FIG. 1 is the cross-sectional view taken a long a line A–A' of FIG. 2. Component parts illustrated in the plan view of FIG. 2 are designated by reference numerals added with 100 to those of corresponding component parts illustrated in FIG. 1. First, referring to FIG. 1, explanation will be made on the configuration (the structure) of the memory cell.

Figure 7:
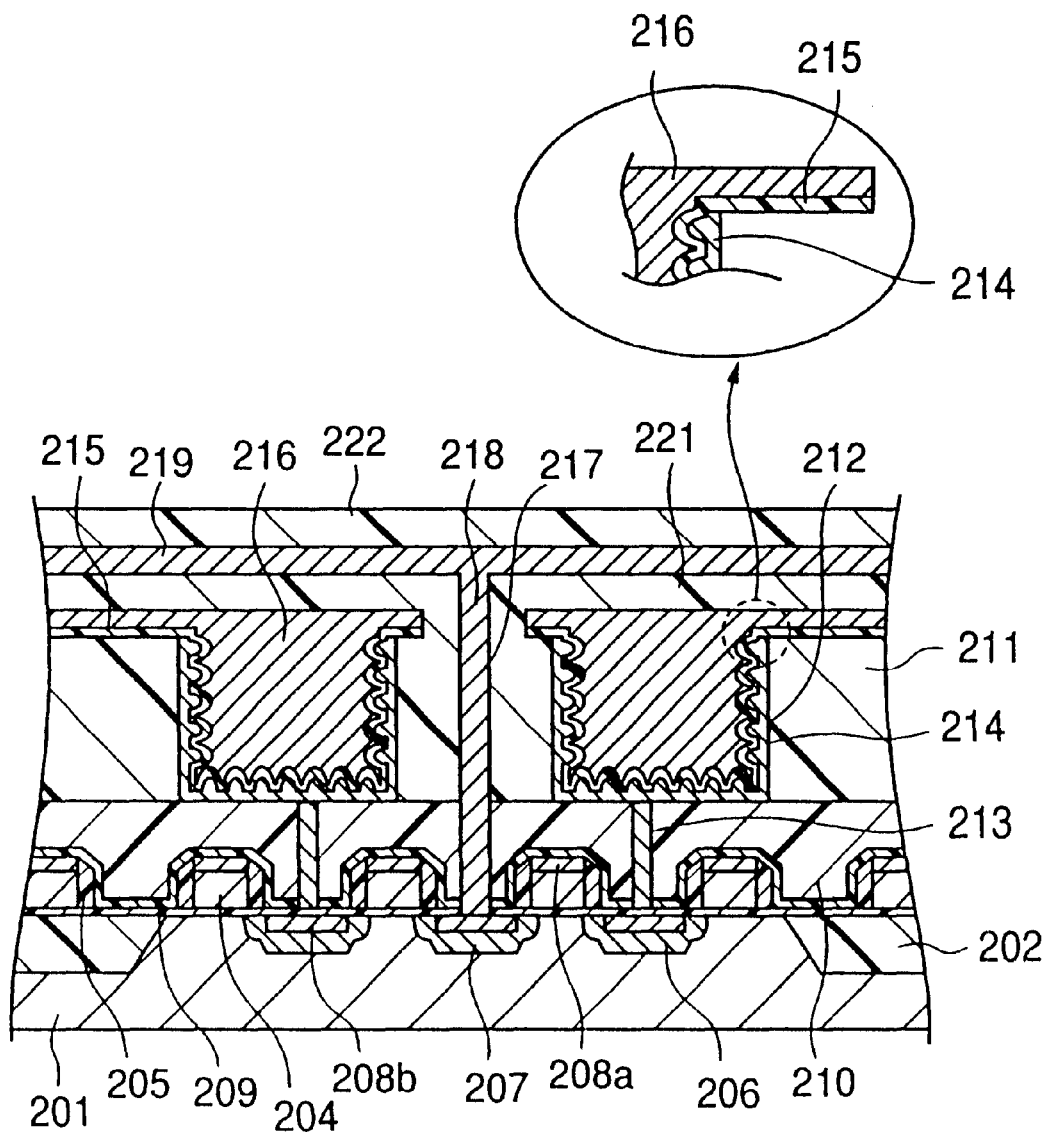
FIG. 7 is a cross-sectional view showing a semiconductor device in the related art.

As is readily understood by comparison with the structure in the related art illustrated in FIG. 7, the structure in the related art includes the two constituents, i.e., the cylinder opening 212 and the capacitor contact 213 in order to form the accumulation electrode 214 (the lower electrode) for the cell capacitor (that is, the accumulation electrode 214 is formed inside of the cylinder opening).

However, in the present embodiment, as shown in FIG. 1, when a first cylinder opening 12 and a second cylinder opening 13 are formed, the second cylinder opening 13 can be formed subsequently to the process for forming the first cylinder opening 12 in only one opening process, unlike in the related art in which at least two processes for forming the capacitor contact, and then, forming the cylinder opening have been required. The first and second cylinder openings can be formed only by using a mask for the first cylinder opening 12.

That is, although the cylinder and the capacitor contact have been formed by the use of the two kinds of masks in the related art, the first and second cylinder openings can be formed by the use of only one kind of mask in an easier manner in view of the process (the reason for this will be explained later in reference to the plane layout).

Next, the detailed structure of the memory cell will be described below in reference to FIG. 1.

First, a gate electrode 4 and impurity diffusion layers 6 and 7 constituting a memory cell transistor are formed on a silicon substrate 1. A capacitor plate 16 is formed via an accumulation electrode 14 and a capacitor insulating film 15. Furthermore, a bit line 19 for writing or reading data in or out of the memory cell is connected to the impurity diffusion layer 7 and a $CoSi_2$ (Cobalt Silicide) layer 8b respectively constituting a source and a drain for the memory cell transistor via a bit line plug 18 having a bit line contact 17 embedded therein.

With respect to the first cylinder opening 12 and the second cylinder opening 13 having the accumulation electrode 14 formed there at, the accumulation electrode 14 is connected to the impurity diffusion layer 6 and the $CoSi_2$ layer 8b respectively constituting the source and the drain for the memory cell transistor via the second cylinder opening 13.

In the first embodiment, a first interlayer film 10 is an oxide film free from any impurity (i.e., anon-doped oxide film); and a second interlayer film 11 is a BPSG (boron phosphorous silicate glass) film doped with boron and phosphor.

Although these films will be explained in detail under the section of a fabricating method, the angle of a wall of the cylinder opening is varied depending upon a difference in impurity concentration, thereby forming the second cylinder opening 13 between the gate electrodes 4.

The gate electrode 4 also has a $CoSi_2$ layer 8a formed thereon in the same manner as the case of the impurity diffusion layers 6 and 7.

The surfaces (i.e., the $CoSi_2$ layers) of the gate electrode 4 and impurity diffusion layers 6 and 7 are covered with a stopper nitride film 9, which is used to provide a difference in etching rate between the oxide film and the nitride film in opening the cylinder so as to once stop etching on the nitride film.

Subsequently, the plane layout of the memory cell will be explained below in reference to FIG. 2.

In this cell, even if no capacitor contact is formed by the use of the two masks in the same manner as in the related art, the accumulation electrode can be connected to the cell transistor owing to the improvement of the fabricating method, described later.

Figure 8:
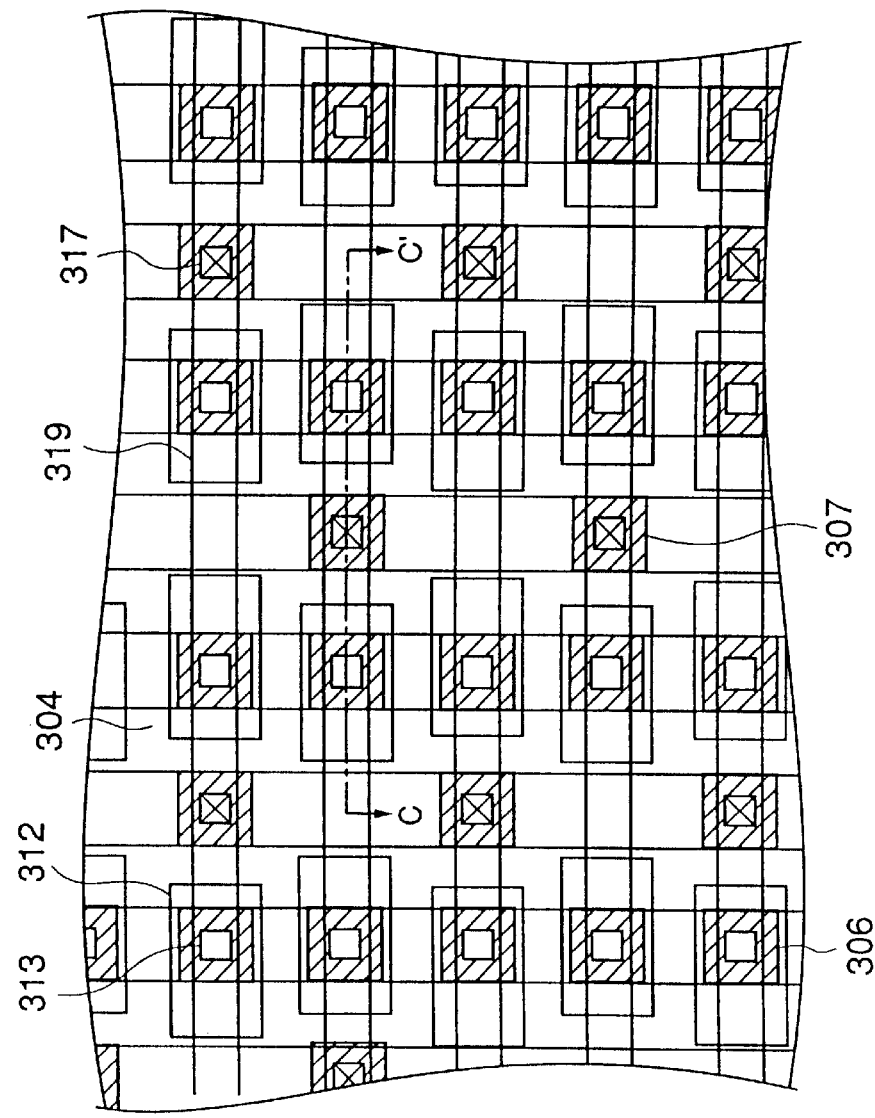
FIG. 8 is a plan view showing the semiconductor device in the related art.
Figure 9A:
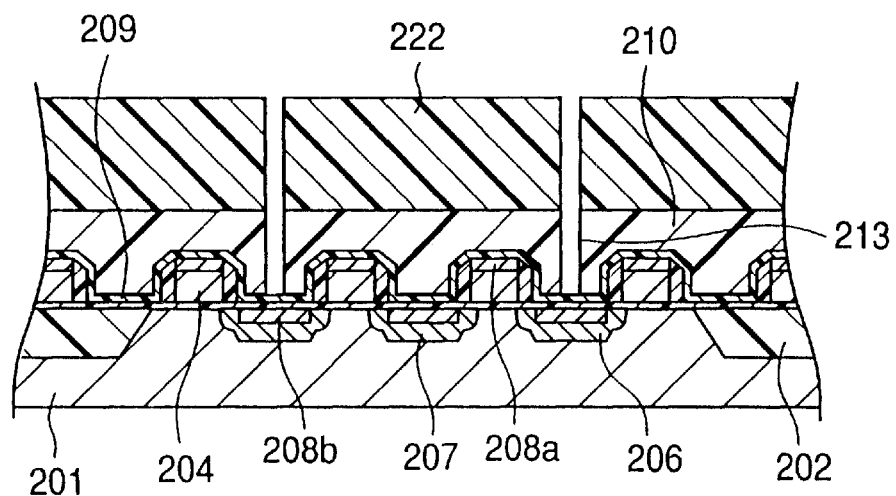
FIGS. 9A to 9D are cross-sectional views each illustrating the respective steps of forming a semiconductor device in the related art.
Figure 9B:
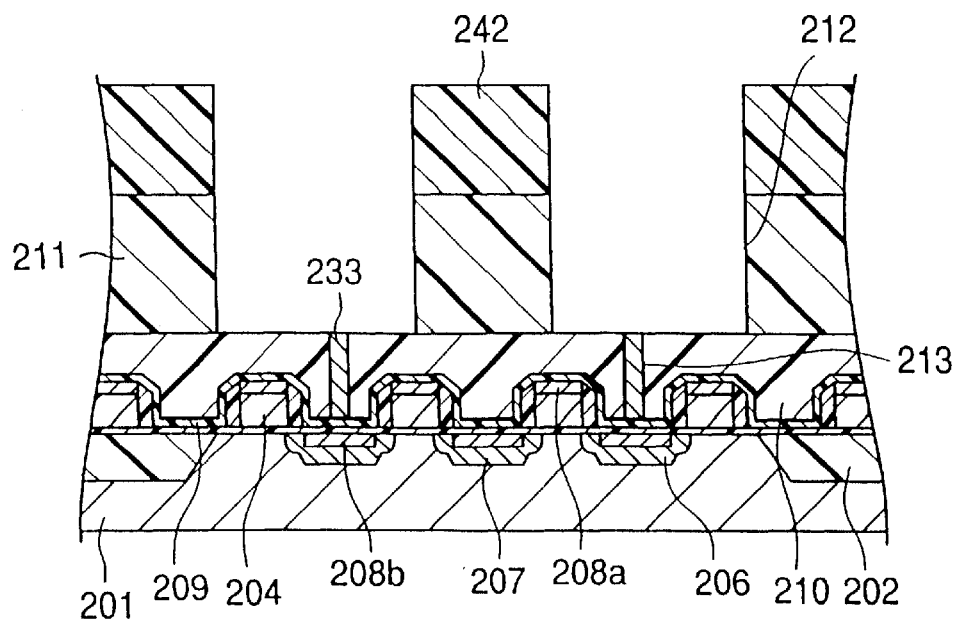
Figure 9C:
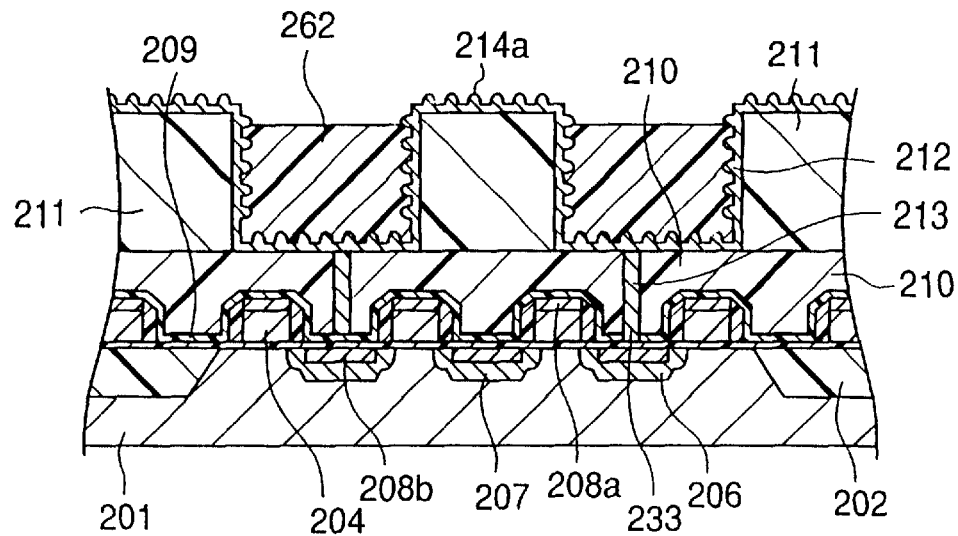
Figure 9D:
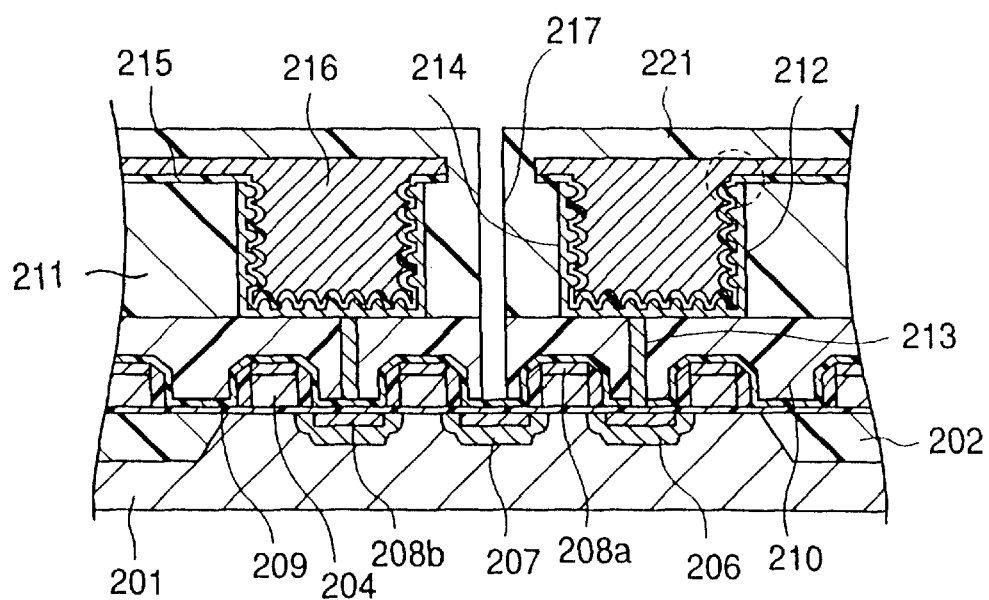

As described already, the cell layout in the related art is the so-called array of the half pitch, as illustrated in FIG. 8. In comparison with the related art, the cell layout according to the present invention is a layout of a quarter pitch. This will be well seen from, in particular, FIG. 2. A bit line contact of an adjacent bit line is arrayed with a deviation in a longitudinal direction of the bit line. The deviation is just equivalent to a quarter of an interval in the longitudinal direction of the bit line of the bit line contact.

Namely, when the adjacent bit lines are observed in sequence, it is found that the bit line contact on the fifth bit line from the target bit line is arrayed in the same manner as that of the target bit line. This array is referred to here as a layout of a quarter pitch.

Although the example adopting the layout of the quarter pitch is illustrated in the present embodiment, the layout is not limited to that in the present embodiment. It is understood that the layout should be applied to the memory cell having the conventional structure of the capacitor contact which is formed by the use of the masks in the two processes.

Referring to FIG. 2, naturally, a capacitor plate opening 123, through which a bit line contact 117 for a capacitor plate 116 penetrates, also is arrayed in the same fashion as that of the bit line contact.

As seen from FIG. 2, since the bit line contact 117 is located at the center, impurity diffusion layers 106 and 107 also are arrayed in the same layout of the quarter pitch as the bit line contact 117. In this sense, the entire cell is referred to as a cell of the layout of the quarter pitch. A cylinder opening 112 is formed above the impurity diffusion layer 106.

In this manner, if the cylinder openings 112 are arrayed in the layout of the quarter pitch, the cylinder openings 112 can be arrayed at equal intervals. Consequently, if the layout of the cylinder is enlarged such that a capacity value becomes as large as possible, the cylinder can take a layout of a regular polygon, although a square in FIG. 2.

In the case of a regular polygon, if the cylinder is reduced as it is, an opening can be defined by a contact 124 between a second cylinder opening 113 and a word line 104 as indicated by a circle in FIG. 2.

The contacts 124 are located at equal intervals and between the gate electrodes 104, and further, also above the impurity diffusion layer 106.

Consequently, when the cylinder (or the cylinder opening) is gradually reduced in the fabricating process, the cylinder (or the accumulation electrode) can be connected to the impurity diffusion layer 106 (the $CoSi_2$ layer 8b in the description in reference to FIG. 1) without providing any capacitor contact.

Therefore, it is one feature of the memory cell that the cylinders are arrayed at equal intervals in the layout of the quarter pitch and regular polygon.

Subsequently, a description will be given of the fabricating method in the first embodiment. The fabricating method will be explained in accordance with the procedure in reference to FIGS. 3A to 3D.

Figure 3A:
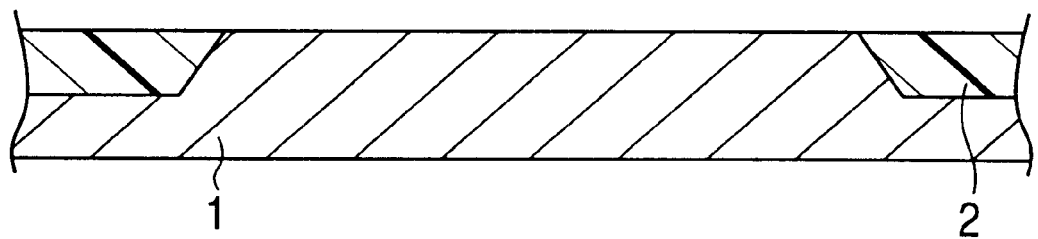
FIGS. 3A to 3F are cross-sectional views each illustrating the respective steps of forming a semiconductor device in the first embodiment according to the present invention.

First, a device isolation insulating film 2 is formed on the silicon substrate 1 by a known shallow trench isolation (STI) method (FIG. 3A).

Figure 3B:
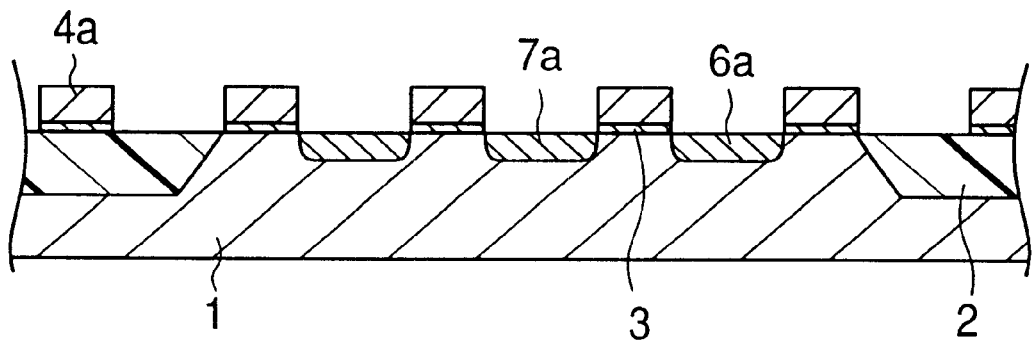

Subsequently, gate oxidation is carried out, thereby forming agate insulating film 3. Furthermore, polycrystalline silicon doped with impurities is grown, and then, agate electrode material 4a is formed by photolithography and dry etching. Thereafter, impurities are doped in this state by ion implantation, thus forming impurity diffusion layers 6a and 7a (FIG. 3B).

In this state, the gate electrode material 4a and impurity diffusion layers are thinly coated with a non-doped oxide film with an excellent coating property. Thereafter, etching-back is performed by the dry etching, whereby the non-doped oxide film remains only on a side wall of the gate electrode material 4a as a side wall spacer 5. Moreover, impurities having a concentration higher than that of the impurity diffusion layers 6a and 7a are doped by the ion implantation, thus forming impurity diffusion layers 6b and 7b. After the doping, the doped impurities are activated by annealing treatment at temperatures of 1000° C. or higher, and then, a film is formed by sputtering Co (cobalt).

Next, heat treatment is carried out to allow Co to react with the gate electrode material 4a and the impurity diffusion layers, respectively, resulting in cobalt silicide. Cobalt (on the oxide film) which cannot react by the heat treatment is removed by wet etching. Further heat treatment stabilizes crystals, so as to reduce the layer resistance of the gate electrode material 4a and impurity diffusion layers.

Figure 3C:
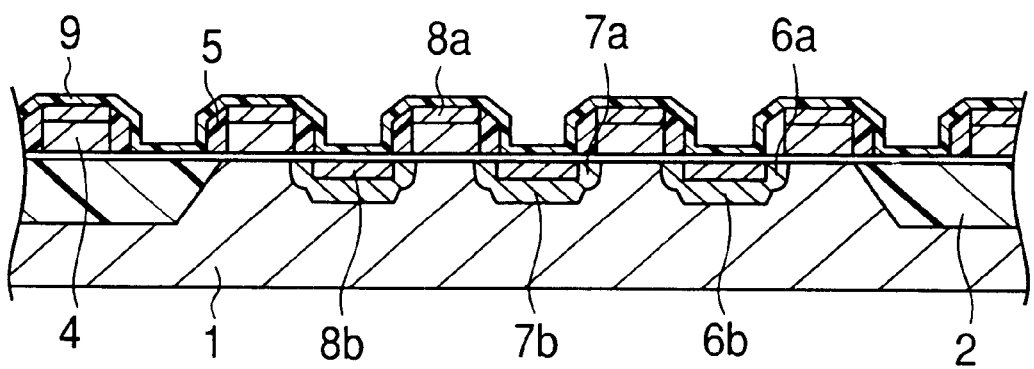

With these processes, the $CoSi_2$ layer 8a is formed on the gate electrode material 4a, and therefore, it constitutes part of the gate electrode 4. The $CoSi_2$ layer 8b is formed also on the impurity diffusion layer. Moreover, the stopper nitride film 9 is formed in about 3 to 100 nm (FIG. 3C).

Subsequently, the non-doped oxide film is grown, thus forming the first interlayer film 10. Furthermore, a BPSG film is formed in the height of the cylinder (the accumulation electrode), i.e., in such a thickness as to provide a capacity value required for the cell capacitor, thereby obtaining the second interlayer film 11.

In this state, the first cylinder opening 12 and the second cylinder opening 13 are formed by the photolithography and the dry etching by the use of the mask for forming the first cylinder opening 112 as illustrated in FIG. 2.

That is, the resist of a cylindrical shape as the mask for the etching is formed on the second interlayer film 11. The etching for forming the first cylinder opening 12 is conducted under the conditions that there is an etching selection between the oxide film and the nitride film, for example, the etching of the oxide film proceeds but the etching of the nitride film cannot proceed, and that deposition occurs while the etching is conducted. Consequently, the wall surface of the first cylinder opening 12 can be machined with an inclination. If the first interlayer film 10 is etched under the same conditions, the deposition further proceeds since the first interlayer film 10 is the non-doped oxide film, so that the wall surface of the second cylinder opening 13 is inclined at an angle smaller than that of the wall surface of the first cylinder opening 12. At this time, it is effective from the viewpoint of the control of the angle of the inclination that the conditions are positively varied such that the deposition proceeds. For example, etching gas for forming first and second cylinder openings 12, 13 is $C_4F_8$ (Carbon fluoride)+CO(Carbon monoxide)+$O_2$ (oxygen) to form slopes of openings. The greater the amount of flowing CO is or the less the amount of flowing $O_2$ is, the steeper the slope of opening is. The smaller the amount of flowing CO is or the larger the amount of flowing $O_2$ is, the gentler the slope of opening is.

Since the etching of the nitride film hardly proceeds in this etching, the etching cannot markedly proceed even if the second cylinder opening 13 is accidentally brought into slight contact with the stopper nitride film 9 at the time of the etching, thereby preventing any contact between the second cylinder opening 13 and the gate electrode 4.

Figure 3D:
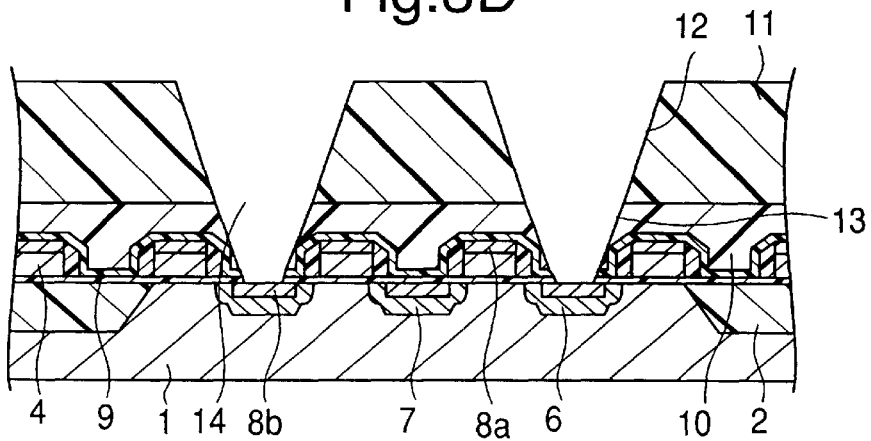

In the second cylinder opening 13, the etching is once stopped on the stopper nitride film 9, and then, only the stopper nitride film 9 is lightly removed by another etching. In this way, only the nitride film is lightly etched at the final stage, thus preventing any introduction of deficiency to the $CoSi_2$ layer 8b caused by the etching (FIG. 3D).

Subsequently, polycrystalline silicon or amorphous silicon doped with impurities is grown to be turned into HSG (Hemi-Spherical Grain) silicon, thereby obtaining an accumulation electrode material 14a.

Figure 3E:
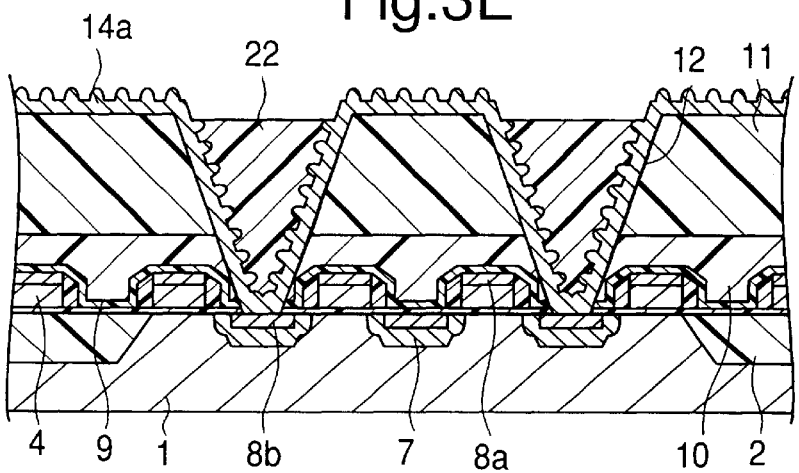

Next, a resist 22 is filled in the cylinder opening covered with the accumulation electrode material 14a (FIG. 3E).

The dry etching is conducted in this state, so that the accumulation electrode material 14a can remain only at portions in contact with the first cylinder opening 12 and the second cylinder opening 13, thus obtaining the accumulation electrode 14.

The surface of the accumulation electrode 14 is subjected to lamp nitriding, and then, a $Ta_2O_5$ layer is formed by CVD, followed by oxidation by the use of a furnace or a lamp anneal, thereby obtaining the capacitor insulating film 15. In the oxidation, it is effective that oxygen is introduced by irradiating the $Ta_2O_5$ layer with oxygen plasma in order to reduce a leak current at the capacitor insulating film.

Figure 3F:
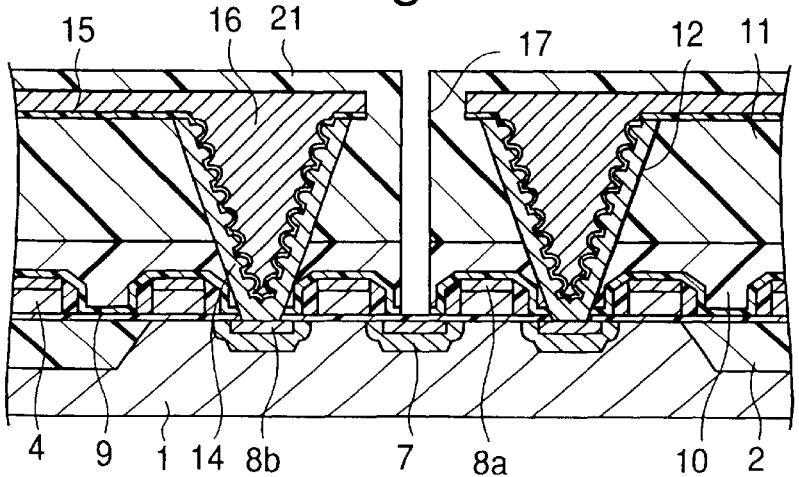

Subsequently, a TiN film is formed by CVD, and further, polycrystalline silicon doped with impurities is grown, thereby forming the capacitor plate 16 by the photolithography and the dry etching. Moreover, a non-doped oxide film or a BPSG film is formed, thus obtaining a third interlayer film 21. Additionally, the bit line contact 17 is opened by the photolithography and the dry etching (FIG. 3F).

Thereafter, a Ti film and another TiN film are formed, and further, tungsten is embedded in the bit line contact 17 to form the bit line plug 18. Subsequently, a TiN film is formed to form the bit line 19 also by the photolithography and the dry etching. Finally, a fourth interlayer film 22 is formed, leading to completion of the memory cell according to the present invention (FIG. 1).

In order to configure a DRAM hybrid logic device, devices such as an MOS transistor which is formed outside of the DRAM simultaneously with the above-described process, are connected via multi-layered wirings.

Figure 4:
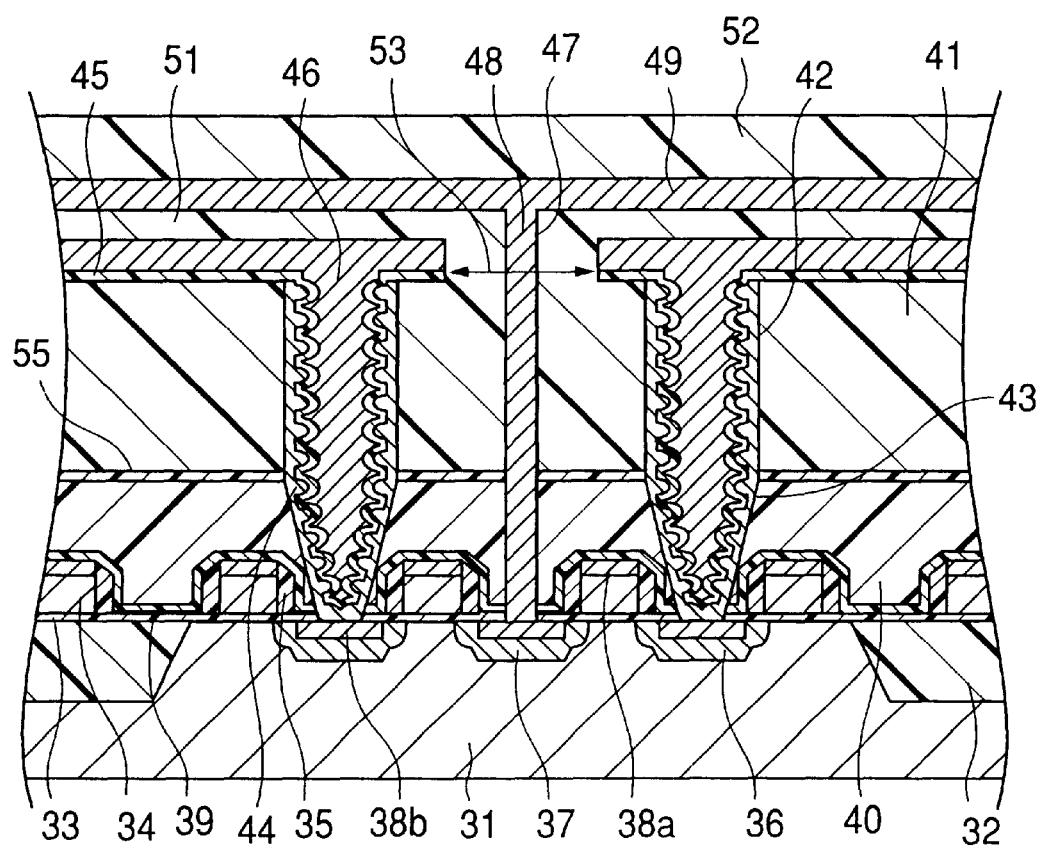
FIG. 4 is a cross-sectional view showing a semiconductor device in a second embodiment according to the present invention.

FIG. 4 shows a semiconductor memory device of a second embodiment according to the present invention. As shown in FIG. 4, an inclination angle of a side wall of a first cylinder opening 42 is different from that in the first embodiment. The first cylinder opening 42 is formed into a substantially vertical shape. A stopper nitride film 55 is formed on a first interlayer film 40, and further, a second interlayer film 41 is formed on the stopper nitride film 55.

In a fabricating method, the first cylinder opening 42 is formed by etching with little side wall deposition in a high etching selective ratio with respect to the nitride film. First, the etching is stopped on the stopper nitride film 55, and then, the stopper nitride film 55 is removed by the etching. Subsequently, the etching is conducted under the conditions that deposition occurs and the etched side wall is inclined. Consequently, the etching is conducted deeply to another stopper nitride film 39 on a $CoSi_2$ layer 38b, where the etching is stopped.

And then, the stopper nitride film 39 on the $CoSi_2$ layer 38b is removed, leading to completion of formation of a second cylinder opening 43.

A method for forming other parts and a layout of a memory cell are identical to those in the first embodiment. In the present second embodiment, the cylinder opening can be enlarged since the side wall of the first cylinder opening 42 is substantially vertical. Therefore, the present second embodiment is more effective than the first embodiment from the viewpoint of secureness of a capacity.

Even if the first interlayer film 40 is not a non-doped oxide film but a BPSG film, in the present second embodiment, it is easy to control the etching of the second cylinder opening 43 by the stopper nitride film 39, thereby facilitating the control of the inclination of the second cylinder opening 43. Additionally, there is an advantage that the kind of the first interlayer film 40 is not limited to the non-doped oxide film.

Figure 5:
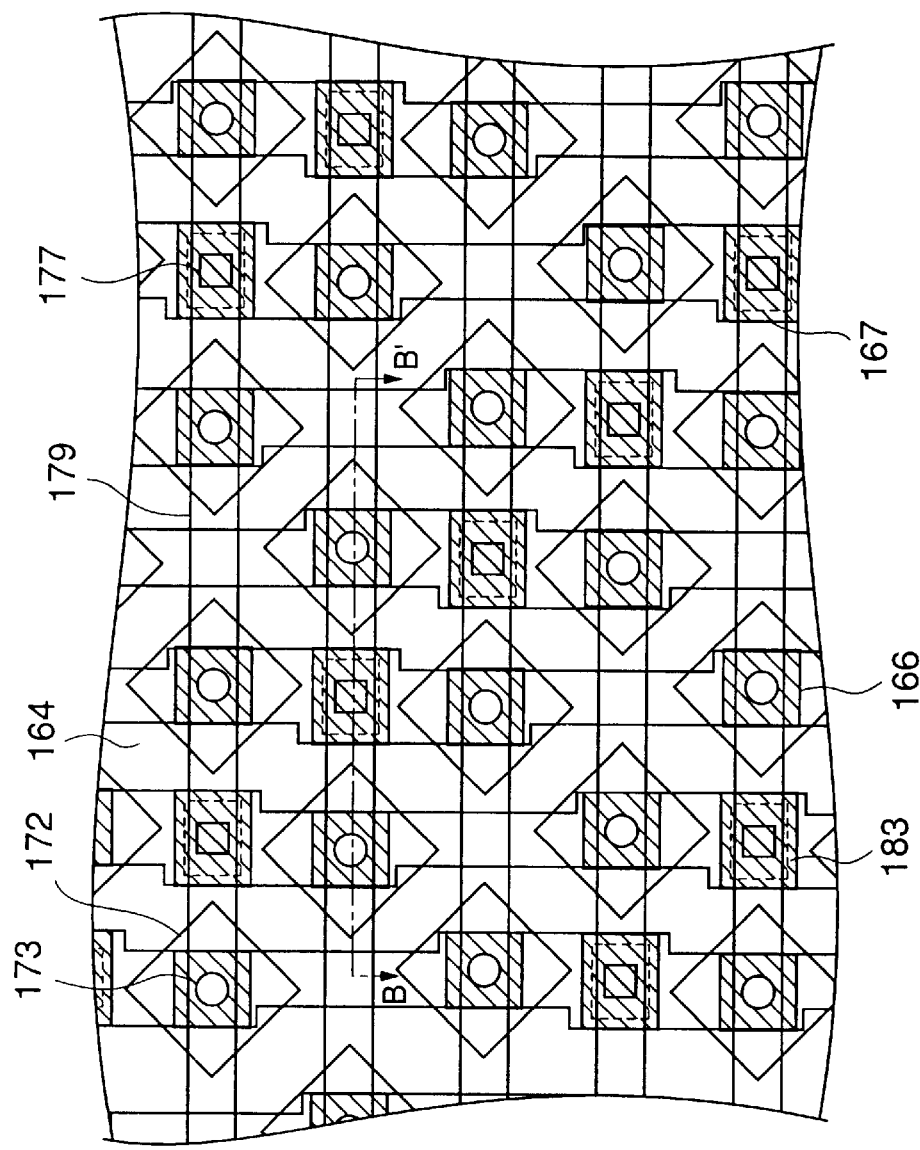
FIG. 5 is a plan view showing a semiconductor device in a third embodiment according to the present invention.
Figure 6:
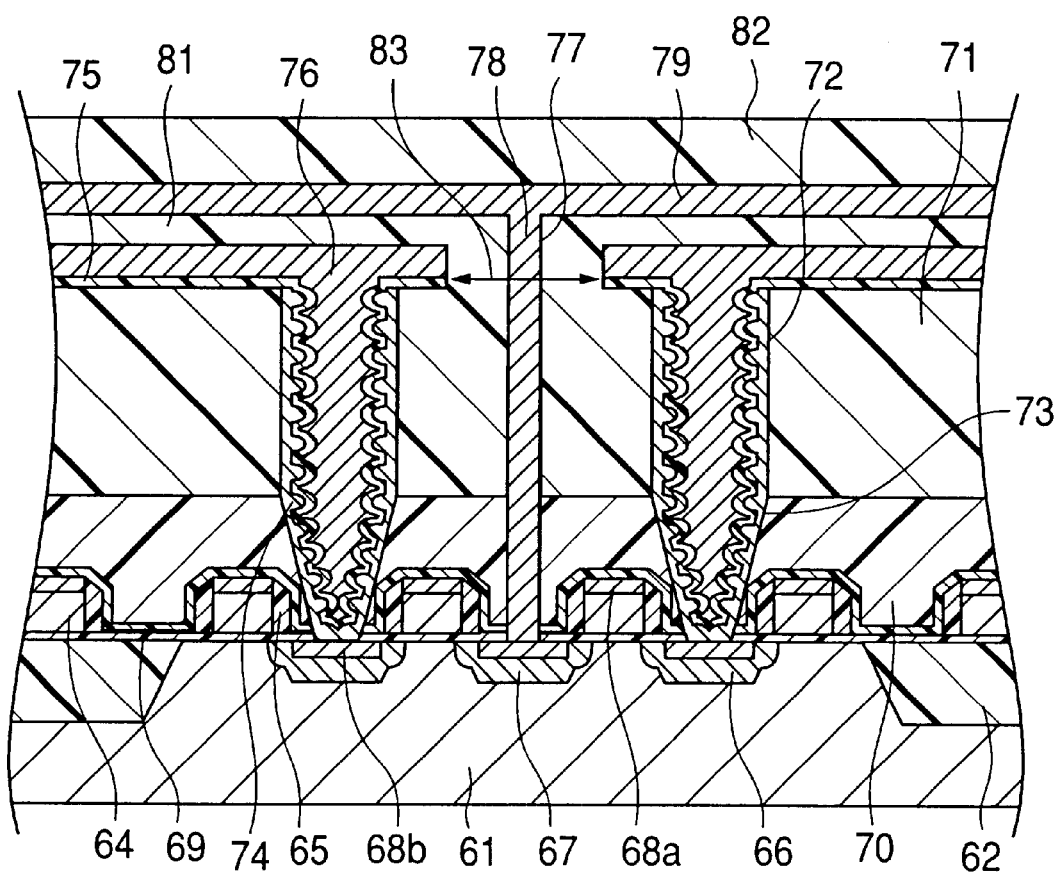
FIG. 6 a cross-sectional view showing the semiconductor device in the third embodiment according to the present invention.

Finally, a third embodiment will be explained below in reference to FIGS. 5 and 6. FIG. 5 illustrates a cell layout in the third embodiment; and FIG. 6 is a cross-sectional view taken along a line B–B' of FIG. 5. Component parts shown in the plan view of FIG. 5 are designated by reference numerals added with 100 to those designating component parts illustrated in FIG. 6.

In comparison with the first embodiment, a word line 164 corresponding to a gate electrode 64 is laid out in a bent fashion, as shown in FIG. 5. The word line 164 is bent in such a manner as to increase the width of the gate electrode 64 adjacent to a portion at which a bit line contact 177 is opened.

As shown in FIG. 5, this layout can enlarge a capacitor plate opening 183 for allowing the bit line contact 177 to penetrate therethrough, ina capacitor plate 176. Consequently, it is possible to easily avoid any contact (short-circuiting) between the bit line contact 177 and the capacitor plate 176, with an attendant advantage in view of improvement in yield in comparison with the cases of the first and second embodiments.

As seen from FIG. 6, an interval between a bit line plug 78 and a capacitor plate 76 can be increased more than in the first and second embodiments.

The first and second embodiments are combined into a fabricating method in the present embodiment. A first interlayer film 70 is anon-doped oxide film (which has no stopper nitride film formed thereon, unlike in the second embodiment), and a second interlayer film 71 formed on the first interlayer film 70 is a BPSG film. Furthermore, a first cylinder opening 72 formed on the second interlayer film 71 is formed into a vertical shape which is advantageous in securing a cell capacitor. A difference from the second embodiment resides in that etching of the first cylinder opening 72 is stopped upon exposure of the first interlayer film 70. The etching is stopped based on the detection result of a difference in concentration between the BPSG film to be etched and the non-doped film. An interval between gate electrodes 64 is adjusted by devising a layout, so that a margin may be formed on a side of the second cylinder opening 73, or a margin may be allocated to each of the bit line contact and the cylinder opening, unlike in the third embodiment in which the process margin is provided on the side of the bit line contact 77. Moreover, there offers an advantage of no need of forming any stopper nitride film inside the interlayer film.

As described above, although the two masks for the cylinder and the capacitor contact have been used and the processes for forming the masks have been required in forming the DRAM cell capacitor by the use of the cylinder in the related art, the cylinder (the accumulation electrode) is formed only in the process using only one mask for the cylinder opening in the semiconductor device and the fabricating method therefor according to the present invention, so that it is possible to reduce the number of masks and the number of fabricating processes.

Furthermore, the bit line contacts are arrayed in the quarter of the interval between the bit line contacts in the bit lines in the relationship of the distance in the bit line direction between the adjacent bit line contacts, so that it is possible to reduce the number of fabricating processes with an attendant effect of reduction of the size of a chip in the semiconductor device and the fabricating method therefor according to the present invention.

What is claimed is:

1. A semiconductor device comprising:
    a semiconductor substrate;
    a first interlayer dielectric film covering the semiconductor substrate;
    a second interlayer dielectric film covering the first interlayer dielectric film;
    an opening having an upper-layer opening penetrating the second interlayer dielectric film, and a lower-layer opening penetrating the first interlayer dielectric film down to the surface of the semiconductor substrate and being connected to the upper-layer opening, said lower-layer opening being arranged such that diameter of the lower-layer reduces gradually from the upperlayer opening toward the semiconductor substrate; and
    a first capacitor electrode film formed in said lower-layer opening with a space remaining in a part of said lower-layer openings; and
    a second capacitor electrode film formed in said space to face said first capacitor electrode film.

2. The device as claimed in claim 1, wherein the upper-layer opening is arranged such that diameter of said upper-layer opening reduces gradually toward the lower-layer opening.

3. The device as claimed in 2, said device further comprising:
    gate electrodes formed on the semiconductor substrate; and
    a passivation insulating film covering the gate electrodes and exposed to a portion of side surfaces of the lower-layer opening.

4. The device as claimed in claim 3, wherein the passivation insulating film is formed under the first interlayer dielectric and covers at least the surface of the semiconductor substrate between the gate electrodes.

5. The device as claimed in claim 4, wherein the lower-layer opening penetrates the passivation insulating film between the gate electrodes down to the surface of the semiconductor substrate.

6. The device as claimed in claim 1, wherein diameter of the upper-layer opening is substantially uniform.

7. The device as claimed in claim 1, said device further comprising;

a first bit line extending in a first direction;

a second bit line extending in said first direction and being adjacent to said first bit line;

first, second, third and fourth word lines arranged in said first direction in that order, each of said first, second, third and fourth word lines extending in a second direction substantially perpendicular to said first direction;

a plurality of capacitor contacts formed between said first and second word lines under said first bit line, between said third and fourth word lines under said first bit line, and between said second and third word lines under said second bit line, respectively; and a plurality of bit line contacts formed between said second and third word lines under said first bit line and between said third and fourth word lines under said second bit line.

8. A semiconductor device comprising;

a semiconductor substrate;

first, second and third bit lines formed over said semiconductor substrate arranged in a first direction in that order, each of said first, second and third bit lines extending in a second direction substantially perpendicular to said first direction;

first, second, third and fourth word lines over said semiconductor substrate arranged in said second direction in that order, each of said first, second, third and fourth word lines extending in said first direction;

a plurality of bit line contacts connected to the respective bit lines and said semiconductor substrate, said bit line contacts formed, between said second and third word lines under said first bit line and between said third and fourth word lines under said second bit line, respectively, no bit line contacts formed between first and second word lines under said second bit line and between second and third word lines under said third bit line, and a plurality of capacitor contacts connected to said semiconductor substrate, said capacitor contacts formed between said first and second word lines under said first bit line, between said third and fourth word lines under said first bit line, between said second and third word lines under said second bit line, between said first and second word lines under said third bit line, and between said third and fourth word lines under said third bit line, respectively.

9. The device as claimed in claim 8, wherein distance between adjacent contacts of adjacent bit lines in said first direction is substantially one fourth of distance between adjacent contacts on said first bit line in said second direction.

* * * * *